(12) United States Patent
Wada et al.

(10) Patent No.: US 10,187,980 B2
(45) Date of Patent: Jan. 22, 2019

(54) SUBSTRATE PROVIDED WITH TRANSPARENT CONDUCTIVE FILM

(71) Applicant: NIPPON ELECTRIC GLASS CO., LTD., Otsu-shi, Shiga (JP)

(72) Inventors: Masanori Wada, Otsu (JP); Ken Kashiwadani, Otsu (JP); Toru Hirao, Otsu (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 93 days.

(21) Appl. No.: 15/539,722

(22) PCT Filed: Jan. 13, 2016

(86) PCT No.: PCT/JP2016/050754
§ 371 (c)(1),
(2) Date: Jun. 26, 2017

(87) PCT Pub. No.: WO2016/157930
PCT Pub. Date: Oct. 6, 2016

(65) Prior Publication Data
US 2018/0007786 A1    Jan. 4, 2018

(30) Foreign Application Priority Data
Mar. 31, 2015    (JP) .................. 2015-071470

(51) Int. Cl.
*H05K 1/02*        (2006.01)
*H01L 51/50*    (2006.01)
(Continued)

(52) U.S. Cl.
CPC ........... *H05K 1/0296* (2013.01); *C03C 17/23* (2013.01); *G02F 1/13439* (2013.01);
(Continued)

(58) Field of Classification Search
CPC .............. H05K 1/0296; H05K 3/027; H05K 2201/0326; C03C 2217/94; C03C 2217/948; C03C 2218/328
(Continued)

(56) References Cited

U.S. PATENT DOCUMENTS 4,713,518 A    12/1987    Yamazaki et al.
6,149,988 A    11/2000    Shinohara et al.
(Continued)

FOREIGN PATENT DOCUMENTS

CN    85 1 04934 A    3/1986
CN    103748537 A    4/2014
(Continued)

OTHER PUBLICATIONS

Official Communication issued in European Patent Application No. 16771816.2, dated Oct. 1, 2018.
(Continued)

*Primary Examiner* — Sherman Ng
(74) *Attorney, Agent, or Firm* — Keating and Bennett, LLP

(57) ABSTRACT

Provided is a transparent conductive film-equipped substrate that makes it difficult for an insulating film provided on a portion from which a transparent conductive film has been removed to peel off. The transparent conductive film-equipped substrate 10 includes a substrate 1 and a transparent conductive film 2 provided on the substrate 1 and subjected to patterning, wherein the transparent conductive film-equipped substrate is made up so that: a removal region A1 where the transparent conductive film 2 has been removed by patterning, a non-removal region A2 where the transparent conductive film is left unremoved, and a boundary region A3 provided between the removal region A1 and the non-removal region A2 are formed on the substrate 1;
(Continued)

and the boundary region A3 is formed with insular portions 2*b* in which the transparent conductive film 2 is formed in insular shapes.

5 Claims, 4 Drawing Sheets

(51) Int. Cl.
  *H05B 33/28* (2006.01)
  *H05K 1/03* (2006.01)
  *H05K 3/02* (2006.01)
  *C03C 17/23* (2006.01)
  *G02F 1/1343* (2006.01)

(52) U.S. Cl.
  CPC ............. *H01L 51/50* (2013.01); *H05B 33/28* (2013.01); *H05K 1/0306* (2013.01); *H05K 3/027* (2013.01); *C03C 2217/94* (2013.01); *C03C 2217/948* (2013.01); *C03C 2218/328* (2013.01); *H05K 2201/0326* (2013.01)

(58) Field of Classification Search
  USPC .......................................................... 174/255
  See application file for complete search history.

(56) References Cited

U.S. PATENT DOCUMENTS

| | | |
|---|---|---|
| 2004/0194302 A1 | 10/2004 | Bhullar et al. |
| 2008/0029152 A1 | 2/2008 | Milshtein et al. |
| 2008/0050595 A1* | 2/2008 | Nakagawara ......... C23C 14/086 428/412 |
| 2008/0116425 A1* | 5/2008 | Yasuda ................... H01B 1/22 252/518.1 |
| 2009/0079322 A1* | 3/2009 | Tsutsumi ........ H01L 31/022491 313/349 |
| 2010/0200539 A1* | 8/2010 | Yun .......................... G06F 3/044 216/13 |
| 2013/0241871 A1* | 9/2013 | Huang ..................... G06F 3/044 345/174 |
| 2014/0246225 A1 | 9/2014 | Mizuno et al. |
| 2014/0338960 A1 | 11/2014 | Inoue et al. |

FOREIGN PATENT DOCUMENTS

| | | |
|---|---|---|
| CN | 104054140 A | 9/2014 |
| JP | 51-30971 A | 3/1976 |
| JP | 61-089636 A | 5/1986 |
| JP | 08-222371 A | 8/1996 |
| JP | 2006-267834 A | 10/2006 |
| JP | 2007-207554 A | 8/2007 |
| JP | 2010-003967 A | 1/2010 |
| JP | 2015-185512 A | 10/2015 |

OTHER PUBLICATIONS

Official Communication issued in International Patent Application No. PCT/JP2016/050754, dated Apr. 12, 2016.

* cited by examiner

[FIG. 1]
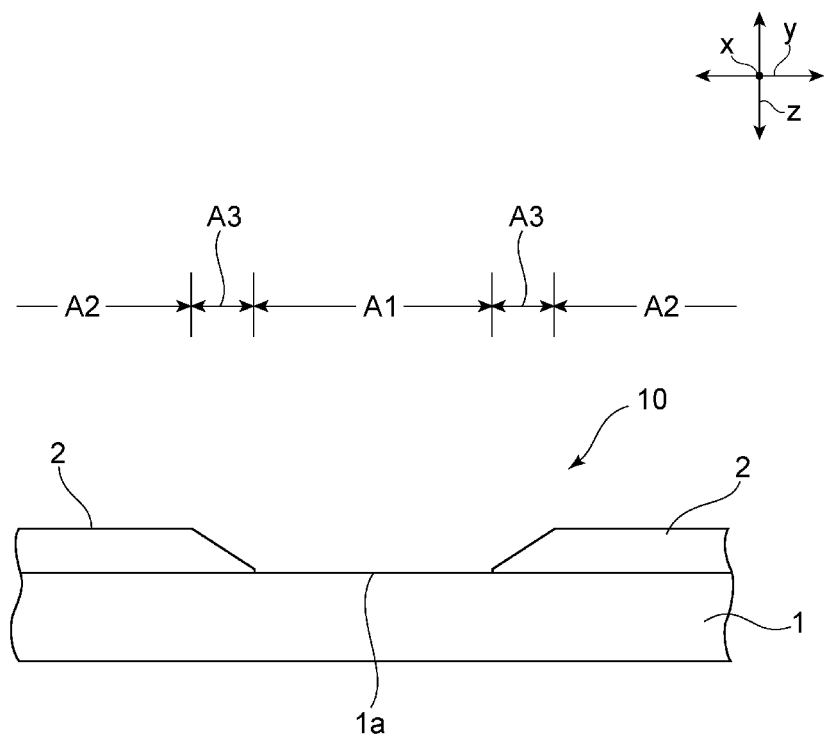

[FIG. 2]
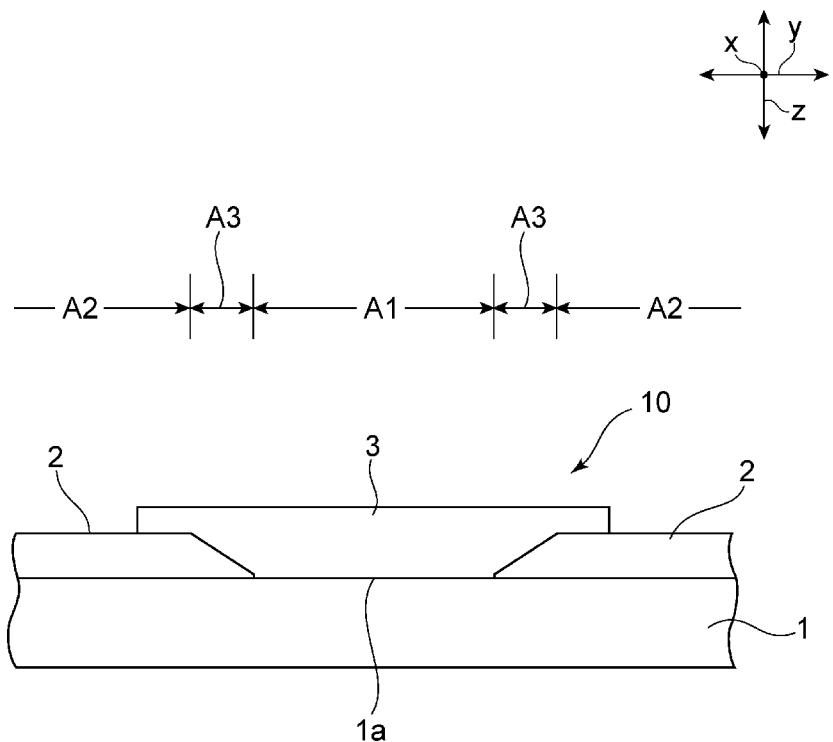
[FIG. 3]
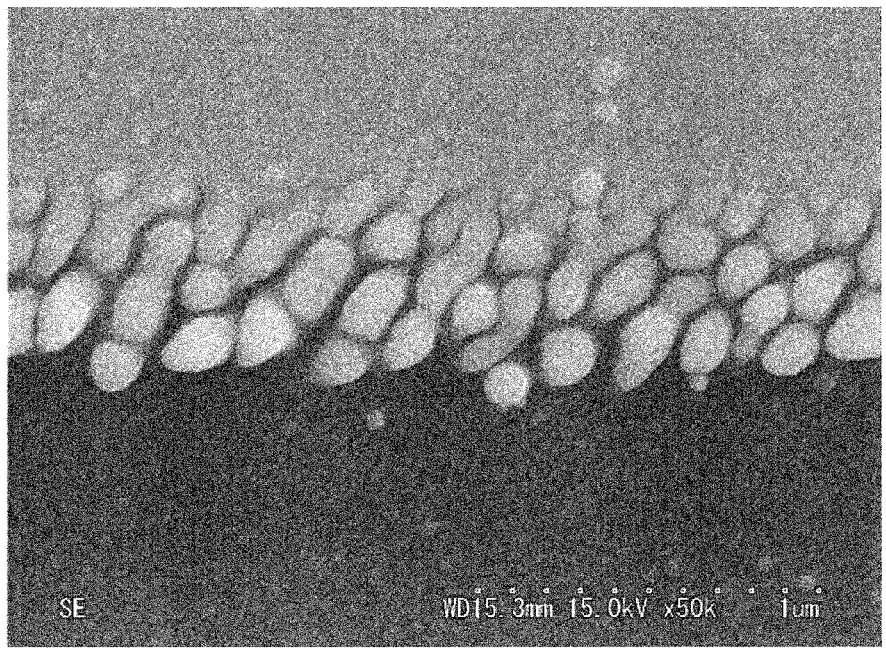

[FIG. 4]
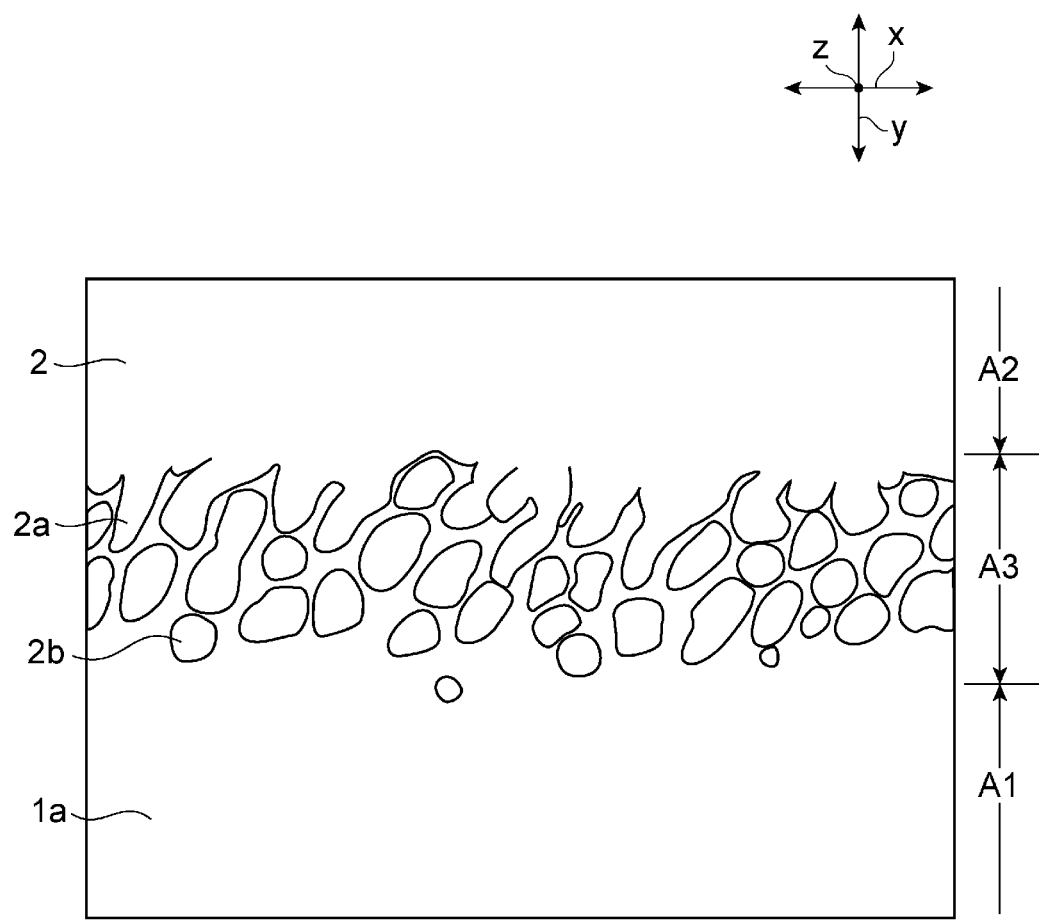

[FIG. 5]
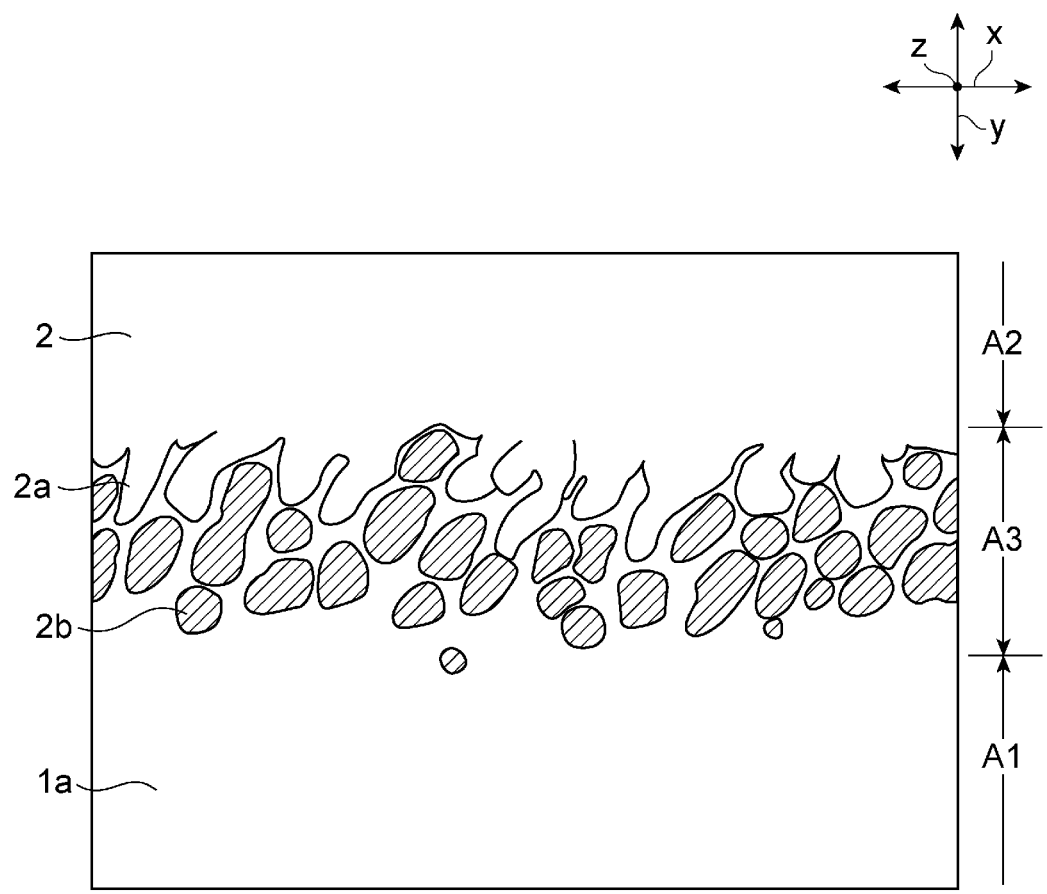

SUBSTRATE PROVIDED WITH TRANSPARENT CONDUCTIVE FILM

TECHNICAL FIELD

The present invention relates to transparent conductive film-equipped substrates.

BACKGROUND ART

In relation to plasma displays, electroluminescent devices, and the like, it is known that a transparent conductive film for use as an electrode is formed on a substrate, such as a glass substrate, and the transparent conductive film is subjected to patterning by laser (Patent Literatures 1 and 2).

Generally, for passivation or the like, an insulating film is provided on a portion of the substrate from which the transparent conductive film has been removed by patterning.

CITATION LIST

Patent Literature

[PTL 1]
JP-A-2007-207554
[PTL 2]
JP-A-2006-267834

SUMMARY OF INVENTION

Technical Problem

The above insulating film is required not to easily peel off from the substrate.

An object of the present invention is to provide a transparent conductive film-equipped substrate that makes it difficult for an insulating film provided on a portion from which a transparent conductive film has been removed to peel off.

Solution to Problem

The present invention is directed to a transparent conductive film-equipped substrate including a substrate and a transparent conductive film provided on the substrate and subjected to patterning, the transparent conductive film-equipped substrate being made up so that: a removal region where the transparent conductive film has been removed by patterning, a non-removal region where the transparent conductive film is left unremoved, and a boundary region provided between the removal region and the non-removal region are formed on the substrate; and the boundary region is formed with insular portions in which the transparent conductive film is formed in insular shapes.

The insular portions as viewed in plan preferably have an area within 25% to 75% of an area of the boundary region.

The substrate is preferably a transparent substrate.

The substrate is preferably a glass substrate.

An example of the patterning that can be cited is patterning by laser. In this case, the laser is preferably femtosecond laser.

Advantageous Effects of Invention

According to the present invention, an insulating film provided on a portion from which a transparent conductive film has been removed can be inhibited from peeling off.

BRIEF DESCRIPTION OF DRAWINGS

FIG. 1 is a schematic cross-sectional view showing a transparent conductive film-equipped substrate according to one embodiment of the present invention.

FIG. 2 is a schematic cross-sectional view showing a state where an insulating film is provided on the transparent conductive film-equipped substrate according to the embodiment shown in FIG. 1.

FIG. 3 is a scanning electron micrograph showing a boundary region of the transparent conductive film-equipped substrate according to the one embodiment of the present invention.

FIG. 4 is a plan view schematically showing the boundary region shown in FIG. 3.

FIG. 5 is a schematic plan view in which insular portions in the boundary region shown in FIG. 4 are hatched.

DESCRIPTION OF EMBODIMENTS

Hereinafter, a description will be given of a preferred embodiment. However, the following embodiment is merely illustrative and the present invention is not limited to the following embodiment. Throughout the drawings, members having substantially the same functions may be referred to by the same reference characters.

FIG. 1 is a schematic cross-sectional view showing a transparent conductive film-equipped substrate according to one embodiment of the present invention. As shown in FIG. 1, a transparent conductive film-equipped substrate 10 according to this embodiment includes a substrate 1 and a transparent conductive film 2 provided on a principal surface 1a of the substrate 1. The transparent conductive film 2 is patterned. By patterning the transparent conductive film 2, a removal region A1 where the transparent conductive film 2 has been removed by patterning and a non-removal region A2 where the transparent conductive film 2 is left unremoved are formed on the principal surface 1a of the substrate 1.

Also formed on the principal surface 1a of the substrate 1 is a boundary region A3 provided between the removal region A1 and the non-removal region A2. As shown in FIG. 1, in the boundary region A3, the thickness of the transparent conductive film 2 gradually decreases with approach to the removal region A1.

Examples of the transparent conductive film 2 that can be used include thin films of composite oxides having electrical conductivity, such as indium tin oxides (ITO), aluminum zinc oxides (AZO), indium zinc oxides (IZO), and fluorine-doped tin oxides (FTO). Indium tin oxides are particularly preferably used. In this embodiment, the transparent conductive film 2 is made of an indium tin oxide. The thickness of the transparent conductive film 2 is preferably within a range of 20 nm to 200 nm and more preferably within a range of 50 nm to 150 nm.

The substrate 1 is preferably a transparent substrate, such as a glass substrate. Examples that can be used as the glass substrate include soda-lime glasses, aluminosilicate glasses, borosilicate glasses, and alkali-free glasses. In this embodiment, a glass substrate made of a soda-lime glass is used.

The patterning of the transparent conductive film 2 is preferably patterning by laser. By patterning the transparent conductive film 2 by laser, part of the transparent conductive film 2 is removed to form the removal region A1. The laser that is used is a laser as to the wavelength of which the transparent conductive film 2 has a high absorptance. For example, an ITO film exhibits high absorptance of wavelengths of 1000 nm or more. Therefore, the ITO film can be patterned using a laser having a wavelength of 1000 nm or more to partly remove the ITO film by laser irradiation, thus forming a removal region A1. By this patterning, concurrently with the formation of the removal region A1, the boundary region A3 is formed around the removal region A1.

No particular limitation is placed on the wavelength of the laser so long as the transparent conductive film 2 has a high absorptance of the wavelength. The wavelength of the laser is, for example, preferably 1000 nm or more, more preferably 1300 nm or more, and still more preferably 1500 nm or more. No particular limitation is placed on the upper limit of the wavelength of the laser, but the wavelength of the laser is generally not more than 2000 nm.

The laser is preferably a sub-10-picosecond pulse laser, more preferably a subpicosecond, ultrashort pulse laser, and particularly preferably a femtosecond laser. By the use of a laser having such a short pulse width, a multiphoton absorption phenomenon is generated, so that patterning can be achieved without diffusing heat to the surrounding portions.

The spot diameter of the laser is preferably within a range of 0.2 times to 5 times the width of the removal region A1 in the y direction and more preferably within a range of 0.5 times to twice the width thereof. The width of the removal region A1 in the y direction is generally preferably within a range of 3 μm to 50 μm and more preferably 5 μm to 20 μm. When the removal region A1 is wide, the patterning may be performed by operating the laser plural times or using a plurality of lasers to somewhat overlap the laser spots. Furthermore, the width of the boundary region A3 in the y direction is generally preferably within a range of 0.3 μm to 10 μm and more preferably 0.5 μm to 5 μm.

The laser is generally applied in the direction of thickness of the transparent conductive film 2 (z direction) from the transparent conductive film 2 side.

The transparent conductive film-equipped substrate 10 according to the embodiment shown in FIG. 1 can be used, for example, as an electrode substrate for an organic electroluminescent device. In this case, an organic electroluminescent layer is provided on top of the transparent conductive film-equipped substrate 10. Furthermore, in this case, in order to increase the extraction efficiency of light from the organic electroluminescent layer, an underlying glass layer having a higher refractive index than the substrate 1 may be provided between the substrate 1 and the transparent conductive film 2.

FIG. 2 is a schematic cross-sectional view showing a state where an insulating film is provided on the transparent conductive film-equipped substrate according to the embodiment shown in FIG. 1. As shown in FIG. 2, an insulating film 3 is provided to cover a portion of the principal surface 1a of the substrate 1 located in the removal region A1 of the transparent conductive film-equipped substrate 10 and the boundary region A3. The insulating film 3 is provided mainly for the purpose of passivation or the like.

The insulating film 3 can be made of an inorganic material, such as silicon nitride, silicon oxide, silicon oxynitride, or aluminum oxide or an organic material, such as epoxy resin, acrylic resin, or urethane resin.

FIG. 3 is a scanning electron micrograph showing the boundary region of the transparent conductive film-equipped substrate according to the one embodiment of the present invention. FIGS. 4 and 5 are plan views schematically showing the boundary region shown in FIG. 3. FIG. 5 is a schematic plan view in which insular portions in the boundary region shown in FIG. 4 are hatched. FIGS. 3, 4, and 5 show the boundary region A3 and its neighboring removal region A1 and non-removal region A2 in plan view, i.e., as viewed from the z direction. Furthermore, FIGS. 3, 4, and 5 show a state shown in FIG. 1 in which the insulating film 3 is not yet provided.

As shown in FIGS. 3, 4, and 5, in the present invention, the boundary region A3 is formed with: peninsular portions 2a made of the transparent conductive film 2 formed continuously from the non-removal region A2 to extend in the y direction; and insular portions 2b made of the transparent conductive film 2 formed substantially separately from the non-removal region A2. The insular portions 2b made of the transparent conductive film 2 can be formed in the boundary region A3 by patterning on predetermined conditions using a laser having a wavelength or pulse width according to the material or other characteristics of the transparent conductive film 2. By forming the insular portions 2b made of the transparent conductive film 2 in the boundary region A3 in this manner, the insulating film 3 provided on top of the insular portions 2b can be inhibited from peeling off. The reason why the insulating film 3 can be inhibited from peeling off can be understood as follows.

When an insulating film 3 is provided on top of the insular portions 2b, the insulating film 3 is formed to make contact with the peripheral sidewalls of the insular portions 2b. Therefore, the insulating film 3 is formed to extend deep in between the adjacent insular portions 2b. Furthermore, the insular portions 2b also lie extended deep in the insulating film 3. It can be understood that for the above reason strong anchoring effects can be exerted to inhibit the insulating film 3 from peeling off. Note that in order to effectively inhibit peeling of the insulating film 3, the area of the insular portions 2b (the hatched, partial area of the insulating film 3) as viewed in plan is preferably within a range of 25% to 75% of the area of the boundary region A3. If the area of the insular portions 2b is smaller than the above range, the number of insular portions 2b extending deep in the insulating film 3 is small, so that the effect of inhibiting peeling of the insulating film 3 may not be achieved. Also, if the area of the insular portions 2b is larger than the above range, the number of portions of the insulating film 3 extending deep in between the insular portions 2b is small, so that the effect of inhibiting peeling of the insulating film 3 may not be achieved. The area of the insular portions 2b is more preferably within a range of 40% to 60% of the area of the boundary region A3. Furthermore, the size of each single insular portion 2b is, in terms of circle-equivalent diameter, preferably within a range of 0.1 μm to 0.6 μm and more preferably 0.1 μm to 0.3 μm.

The borderline position between the non-removal region A2 and the boundary region A3 is, as shown in FIGS. 4 and 5, a position where the transparent conductive film 2 begins to be removed to expose the principal surface 1a and the borderline position between the boundary region A3 and the removal region A1 is a position where the insular portions 2b substantially disappear.

The percentage of the area of the insular portions 2b to the area of the boundary region A3 is preferably determined in a field of view where the area of the boundary region A3 is within a range of 0.7 μm² to 25 μm².

Furthermore, the preferred patterning condition for allowing the area of the insular portions 2b to fall within the above range in the present invention is to use a femtosecond laser.

REFERENCE SIGNS LIST

1 . . . substrate
1a . . . principal surface
2 . . . transparent conductive film
2a . . . peninsular portion
2b . . . insular portion
3 . . . insulating film
10 . . . transparent conductive film-equipped substrate
A1 . . . removal region
A2 . . . non-removal region
A3 . . . boundary region

The invention claimed is:

1. A transparent conductive film-equipped substrate comprising a substrate and a transparent conductive film provided on the substrate and subjected to patterning, the transparent conductive film-equipped substrate being made up so that: a removal region where the transparent conductive film has been removed by patterning, a non-removal region where the transparent conductive film is left unremoved, and a boundary region provided between the removal region and the non-removal region are formed on the substrate; and the boundary region is formed with insular portions in which the transparent conductive film is formed in insular shapes, wherein the insular portions as viewed in plan have an area within 25% to 75% of an area of the boundary region.

2. The transparent conductive film-equipped substrate according to claim 1, wherein the substrate is a transparent substrate.

3. The transparent conductive film-equipped substrate according to claim 1, wherein the substrate is a glass substrate.

4. The transparent conductive film-equipped substrate according to claim 1, wherein the patterning is patterning by laser.

5. The transparent conductive film-equipped substrate according to claim 4, wherein the laser is a femtosecond laser.

* * * * *